(12) United States Patent
Lee

(10) Patent No.: US 7,382,219 B1
(45) Date of Patent: Jun. 3, 2008

(54) INDUCTOR STRUCTURE

(75) Inventor: Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/774,366

(22) Filed: Jul. 6, 2007

(30) Foreign Application Priority Data

May 11, 2007 (TW) ................. 96116843 A

(51) Int. Cl.
*H01F 27/28* (2006.01)
(52) U.S. Cl. .................................. 336/84 C
(58) Field of Classification Search .............. 336/84 C, 336/84 R, 200, 206–208, 232; 257/531
See application file for complete search history.

(56) References Cited

U.S. PATENT DOCUMENTS

| 6,894,598 | B2* | 5/2005 | Heima .................. 336/200 |
| 7,233,224 | B2* | 6/2007 | Strzalkowski et al. ...... 336/200 |
| 2006/0049481 | A1* | 3/2006 | Tiemeijer et al. ........... 257/531 |
| 2006/0202776 | A1* | 9/2006 | Lee et al. .................... 333/25 |
| 2006/0202789 | A1* | 9/2006 | Hyvonen .................... 336/200 |
| 2006/0220737 | A1* | 10/2006 | Sanderson ................... 330/69 |

* cited by examiner

*Primary Examiner*—Tuyen Nguyen
(74) *Attorney, Agent, or Firm*—J.C. Patents

(57) ABSTRACT

An inductor structure including a first helix winding, a second helix winding, and a shielding structure is provided. The first helix winding has a first exterior wire connecting with a first interior wire in series. The second helix winding and the first helix winding are intercoiled about a symmetric plane. The second helix winding has a second exterior wire connecting with a second interior wire in series and connects with the first interior wire. The shielding structure includes a first shielding layer disposed between the first exterior wire and the substrate corresponding to a projection of the first exterior wire and a second shielding layer disposed between the second exterior wire and the substrate corresponding to a projection of the second exterior wire. The first shielding layer and the second shielding layer are grounded individually, and are in symmetry about the symmetric plane.

18 Claims, 7 Drawing Sheets

INDUCTOR STRUCTURE

CROSS-REFERENCE TO RELATED APPLICATION

This application claims the priority benefit of Taiwan application serial no. 96116843, filed May 11, 2007. All disclosure of the Taiwan application is incorporated herein by reference.

BACKGROUND OF THE INVENTION

1. Field of the Invention

The present invention relates to an inductor structure. More particularly, the present invention relates to an inductor structure that can improve Q value.

2. Description of Related Art

Generally speaking, an inductor has energy storage and discharge functions through electromagnetic conversion, so the inductor can be used as an element for stabilizing current. Further, the inductor can be widely utilized, for example, in a radio frequency (RF) circuit. In an integrated circuit (IC), the inductor is a very important and challenging passive device. For the performance of an inductor, the requirement on the quality of the inductor is high, i.e., the inductor must have a high quality factor, which is represented by the Q value. The Q value is defined as follows:

$$Q = \omega \times L/R$$

where $\omega$ is the angular frequency, L is the inductance of a coil, and R is the resistance at a specific frequency taking the inductance loss into account.

Currently, many methods and techniques are available to combine inductors with IC processes. However, in the IC, the restriction on the thickness of the inductor conductor and the interference of the silicon substrate to the inductor will also lead to poor quality of the inductor. In the conventional art, a thick metal is disposed on the top of the inductor to reduce the conductor loss, so as to improve the Q value of the inductor. However, when the thickness of the metal increases to a certain extent, the improvement on the Q value becomes insignificant. Further, as the inductor is often disposed near the silicon substrate, the parasitic capacitance generated between the silicon substrate and the inductor will increase, and the resistance of the inductor will increase accordingly. Thus, much energy must be consumed, and the quality of the inductor is degraded. As a result, it has become the key point of the vigorous development in the industry to solve the problems in the process to raise the Q value of the inductor and reduce the conductor loss.

SUMMARY OF THE INVENTION

The present invention is directed to providing an inductor structure, capable of reducing parasitic capacitance between a substrate and the inductor, and improving quality of the inductor.

The present invention provides an inductor structure disposed on a substrate. The inductor structure includes a first helix winding, a second helix winding, and a shielding structure. The first helix winding at least includes a first exterior wire and a first interior wire connected with the first exterior wire in series. The first interior wire rotates in helical fashion towards a central portion of a helical structure of the first helix winding. The second helix winding and the first helix winding are intercoiled about a symmetric plane. The second helix winding at least includes a second exterior wire and a second interior wire connected with the second exterior wire in series. The second interior wire rotates in helical fashion towards a central portion of a helical structure of the second helix winding, and is connected with the first interior wire. The shielding structure includes a first shielding layer and a second shielding layer. A first shielding layer is disposed between the first exterior wire and the substrate corresponding to a projection of the first exterior wire. A second shielding layer is disposed between the second exterior wire and the substrate corresponding to a projection of the second exterior wire. The first shielding layer and the second shielding layer are grounded individually, and are in symmetry about the symmetric plane.

In order to make the aforementioned features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1A:
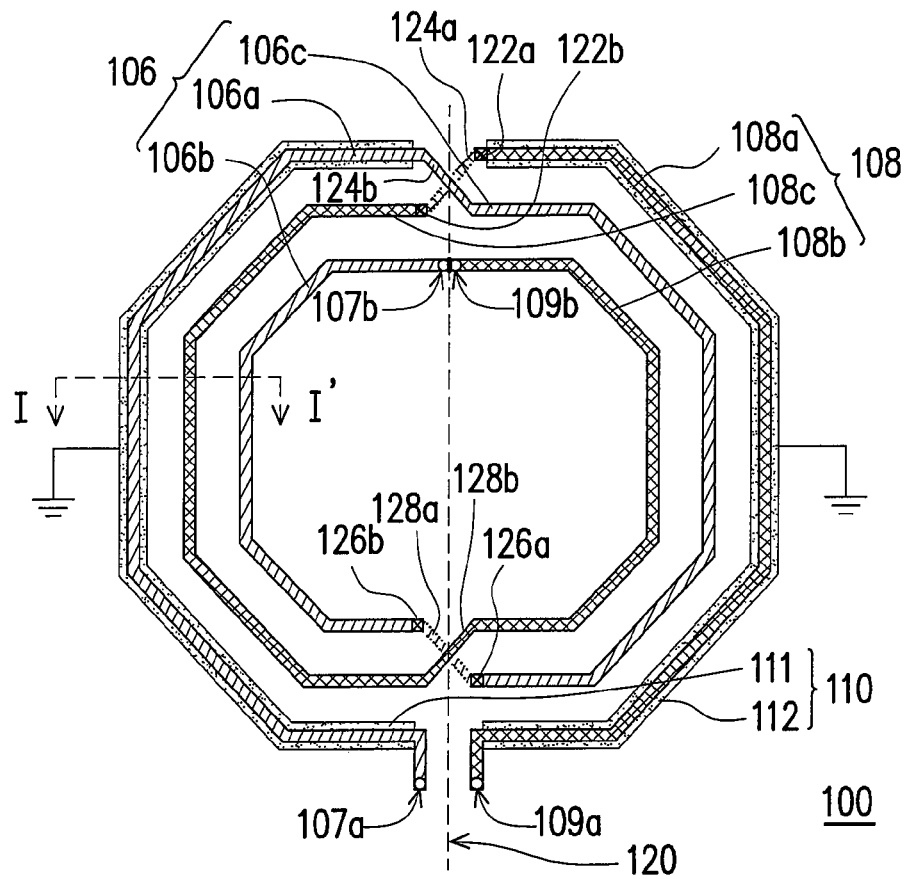
FIG. 1A is a schematic top view of an inductor structure according to a first embodiment of the present invention.
Figure 1B:
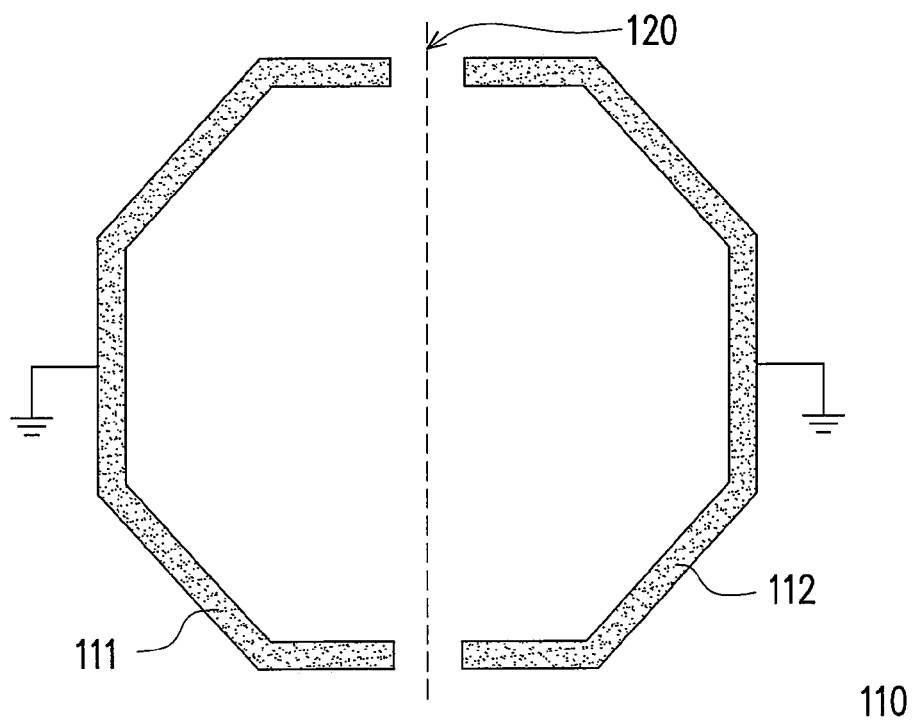
FIG. 1B is a schematic top view of a shielding structure according to the first embodiment of the present invention.
Figure 1C:
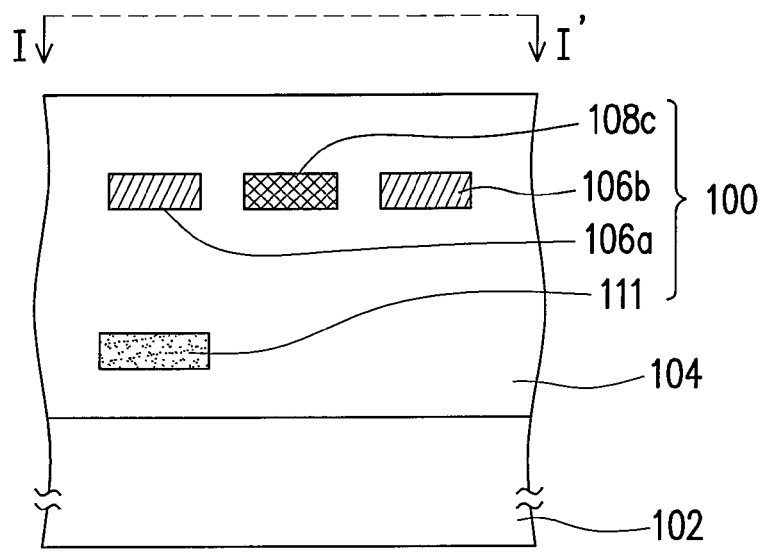
FIG. 1C is a schematic sectional view taken along a section line I-I' in FIG. 1A.

FIG. 1A is a schematic top view of an inductor structure according to a first embodiment of the present invention. FIG. 1B is a schematic top view of a shielding structure according to a first embodiment of the present invention. FIG. 1C is a schematic sectional view taken along a section line I-I' in FIG. 1A.

Referring to FIGS. 1A, 1B and 1C, an inductor structure 100 is disposed in a dielectric layer 104 on a substrate 102. The inductor structure 100 includes a helix winding 106, a helix winding 108, and a shielding structure 110. The inductor structure 100 can be realized through a semiconductor process, and the substrate 102, for example, is a silicon substrate. The material of the dielectric layer 104 is, for example, silicon oxide or other dielectric materials. The material of the helix winding 106 and the helix winding 108 can be a metal, such as copper and aluminum-copper alloy. The material of the shielding structure 110 can be a conductive material, such as polysilicon or a metal. In addition, in the first embodiment, the inductor structure 100 is octagonal shaped (as shown in FIG. 1A), but the inductor structure of the present invention is not limited to the configurations as shown in the embodiments.

In view of the above, the helix winding 106 at least includes an exterior wire 106a and an interior wire 106b connected with the exterior wire 106a in series. The helix winding 106 has an end point 107a and an end point 107b. The end point 107a is, for example, an end of the exterior wire 106a, and the end point 107b is, for example, an end of the interior wire 106b. In other words, the end point 107a is disposed at an outer side of the helix winding 106, and the end point 107b rotates in helical fashion towards a central portion of a helical structure of the helix winding 106.

The helix winding 108 and the helix winding 106 are, for example, disposed on a plane of the same height. The helix winding 108 and the helix winding 106 are disposed in mirror symmetry about a symmetric plane 120 and intercoiled, so as to form a symmetric helix loop structure. For example, the extension direction of the symmetric plane 120 is towards the inside of a page. The helix winding 108 at least includes an exterior wire 108a and an interior wire 108b connected with the exterior wire 108a in series. The helix winding 108 has an end point 109a and an end point 109b. The end point 109a is, for example, an end of the exterior wire 108a, and the end point 109b is, for example, an end of the interior wire 108b. The end point 109a is, for example, disposed outside the helix winding 108 at a position symmetric to the end point 107a. The end point 109b is, for example, rotates in helical fashion towards a central portion of a helical structure of the helix winding 108 from a position symmetric to the end point 107b. The end point 107b and the end point 109b are connected together on the symmetric plane 120. In other words, the helix winding 106 and the helix winding 108 are connected at the innermost turn of the symmetric helix loop structure.

As shown in FIG. 1A, for example, the helix winding 106 and the helix winding 108 are intercoiled into a three-turn winding structure. Therefore, the helix winding 106 and the helix winding 108 can further include a connecting wire 106c and a connecting wire 108c respectively. The connecting wire 106c is, for example, disposed between the exterior wire 106a and the interior wire 106b. The exterior wire 106a and the interior wire 106b are, for example, connected in series through the connecting wire 106c. The connecting wire 108c is, for example, disposed between the exterior wire 108a and the interior wire 108b. The exterior wire 108a and the interior wire 108b are, for example, connected in series through the connecting wire 108c.

Definitely, the turns that the helix winding 106 and the helix winding 108 are intercoiled not limited to three turns as shown in FIG. 1A. In other embodiments, when the helix winding 106 and the helix winding 108 are intercoiled into two-turn winding, the exterior wire 106a and the interior wire 106b can be directly connected in series, and the exterior wire 108a and the interior wire 108b are connected in the same way. In addition, plural turns of connecting wire 106c can be further disposed between the exterior wire 106a and the interior wire 106b, and plural turns of connecting wire 108c is disposed between the exterior wire 108a and the interior wire 108b correspondingly, such that the helix winding 106 and the helix winding 108 are intercoiled to form a helix loop structure with more than three turns. Persons of ordinary skill in the art can make adjustment as required.

Referring to FIG. 1A, for example, the helix winding 106 and the helix winding 108 are intercoiled in a manner of interlacing the helix winding 106 and the helix winding 108 on the symmetric plane 120. The helix winding 106 and the helix winding 108 do not contact at interlaced positions, so as to prevent short circuit. For example, the exterior wire 108a is connected to a bonding wire 124a below through a via 122a, and then the bonding wire 124a is connected to the connecting wire 108c through a via 122b, such that the helix winding 108 passes below the helix winding 106 at the interlaced position, so as to prevent the helix winding 106 from contacting the helix winding 108. Moreover, the exterior wire 106a and the connecting wire 106c are connected through a bonding wire 124b on a plane of the same height. In another aspect, the connecting wire 106c and the interior wire 106b are, for example, connected through a via 126a, a bonding wire 128a, and a via 126b sequentially, such that the helix winding 106 passes below the helix winding 108 at the interlaced position. The connecting wire 108c and the interior wire 108b are connected through a bonding wire 128b on a plane at the same height.

In another aspect, referring to FIGS. 1A, 1B, and 1C, the shielding structure 110 includes a shielding layer 111 and a shielding layer 112. The shielding layer 112 and the shielding layer 111 are, for example, disposed on a plane of the same height. The shielding layer 111 is disposed between the exterior wire 106a and the substrate 102 corresponding to a projection of the exterior wire 106a. The shielding layer 112 is disposed between the exterior wire 108a and the substrate 102 corresponding to a projection of the exterior wire 108a. The shielding layer 111 and the shielding layer 112 are grounded individually. In addition, the shielding layer 111 and the shielding layer 112 are disposed in symmetry about the symmetric plane 120, and are separated without connected to each other. In other words, the shielding layer 111 and the shielding layer 112, for example, form an annular structure with two gaps (as shown in FIG. 1B). The gaps in the annular structure, for example, are disposed along the symmetric plane 120, and the positions of the gaps, for example, are corresponding to the projection of the interlaced positions of the helix winding 106 and the helix winding 108. Thus, in the inductor structure 100, at least the exterior wire 106a and the exterior wire 108a are projected on the shielding structure 110.

It should be noted that when the inductor structure 100 is applied in a symmetric differential inductor, i.e., when the voltage applied on the end point 107a and the voltage applied on the end point 109a have a same absolute value but opposite electrical properties, in the winding structure constituted by the helix winding 106 and the helix winding 108, the absolute value of the voltage gradually decreases towards the interior of the windings. In other words, the exterior wire 106a and the exterior wire 108a have a stronger electrical field. As the shielding structure 110 blocks between the exterior wire 106a and the exterior wire 108a having the stronger electrical field and the substrate 102, and the shielding layer 111 and the shielding layer 112 are grounded individually, the parasitic capacitance between the exterior wires 106a, 108a and the substrate 102 is reduced, and the energy loss is reduced. In addition, when the inductor structure 100 is applied in a single-ended inductor, i.e., the voltage is applied on the end point 107a or the end point 109a, and the other end is grounded, the shielding layer 111 and the shielding layer 112 can provide the same effect, so as to reduce the energy loss.

Figure 2A:
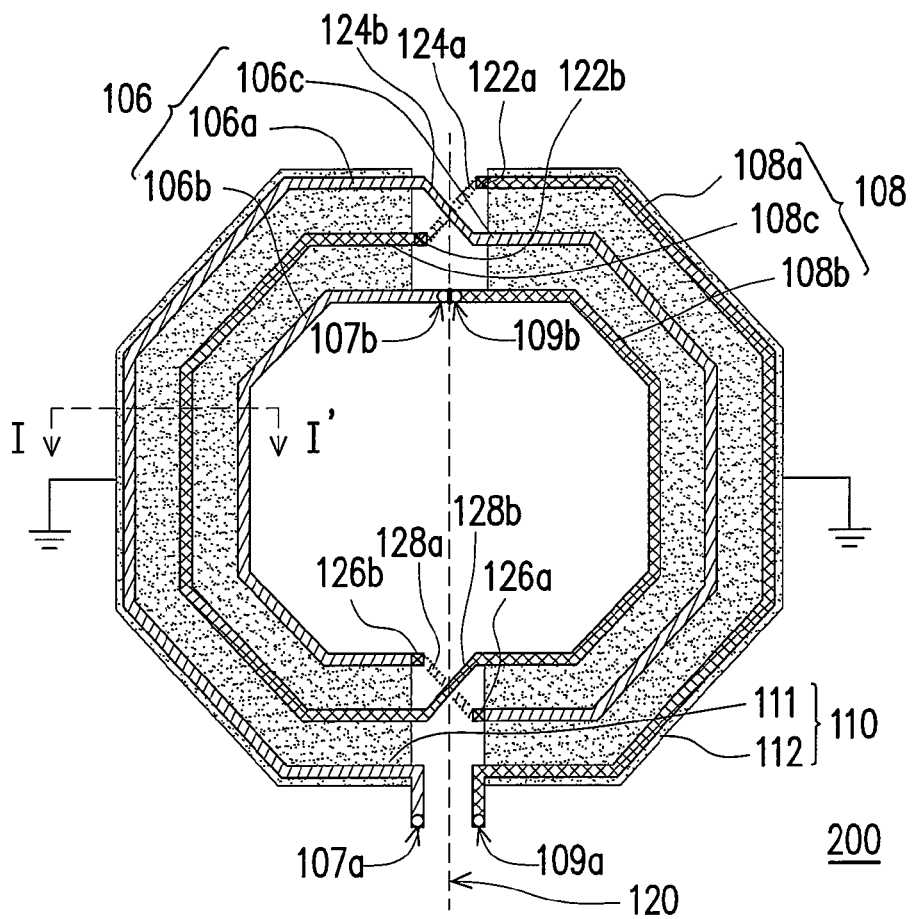
FIG. 2A is a schematic top view of an inductor structure according to a second embodiment of the present invention.
Figure 2B:
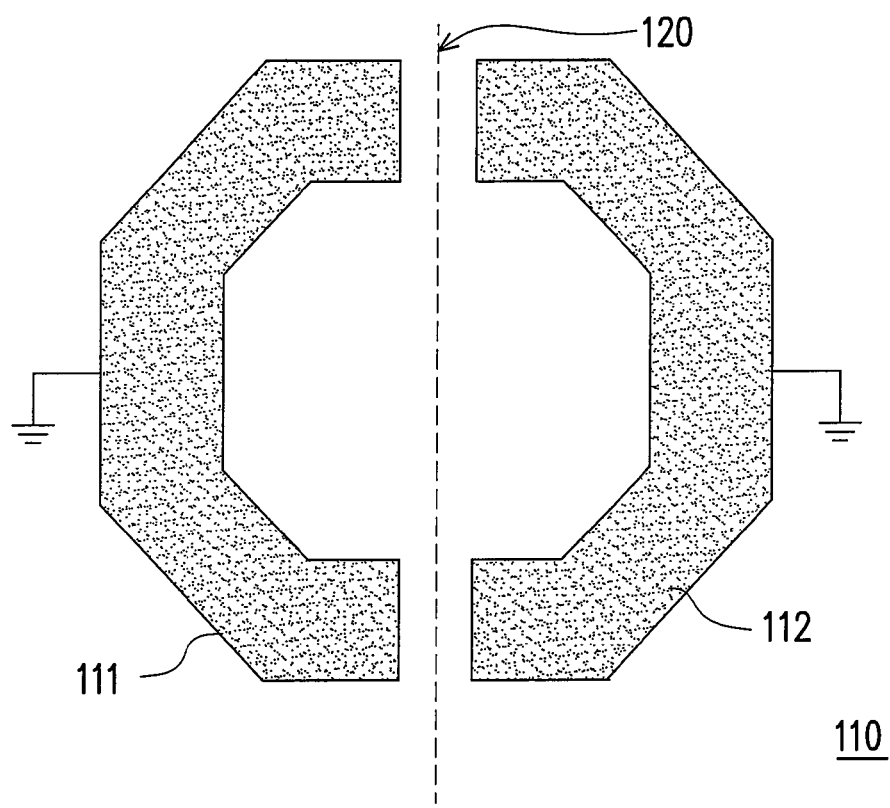
FIG. 2B is a schematic top view of a shielding structure according to the second embodiment of the present invention.
Figure 2C:
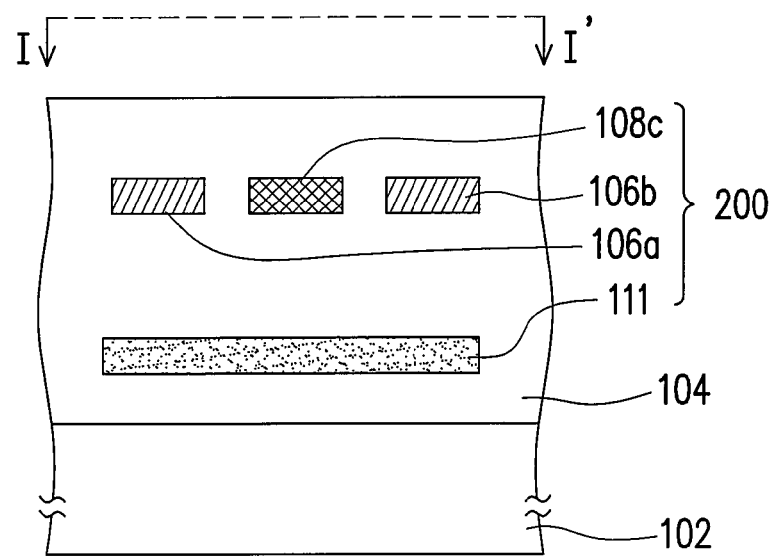
FIG. 2C is a schematic sectional view taken along a section line I-I' in FIG. 2A.

FIG. 2A is a schematic top view of an inductor structure according to a second embodiment of the present invention. FIG. 2B is a schematic top view of a shielding structure according to the second embodiment of the present invention. FIG. 2C is a schematic sectional view taken along a section line I-I' in FIG. 2A. In FIGS. 2A-2C, like component numerals are used to indicate like components appearing in FIGS. 1A-1C, and will not be described herein again.

The present invention provides another inductor structure. Referring to FIGS. 2A, 2B and 2C, the components of the inductor structure 200 are the same as those of the inductor structure 100, except that in the inductor structure 200, besides the exterior wire 106a and the exterior wire 108a, the connecting wire 106c, the connecting wire 108c, the interior wire 106b, and the interior wire 108b are all projected on the shielding structure 110. That is, the shielding layer 111 can shield the exterior wire 106a, the connecting wire 108c, and the interior wire 106b. The shielding layer 112 can shield the exterior wire 108a, the connecting wire 106c, and the interior wire 108b.

It should be noted that as long as the shielding structure 110 can shield the exterior wire 106a and the exterior wire 108a having a stronger electrical field intensity, the parasitic capacitance generated between the inductor structure 100 and the substrate 102 can be reduced, and the resistance value can be decreased, so as to reduce the energy loss (as shown in FIG. 1C). In another aspect, for example in FIG. 2C, the helix winding 106 and the helix winding 108 are projected onto the shielding structure 110 except the interlaced positions. Under such circumstance, the shielding structure 110 can generate better shielding effect between the inductor structure 200 and the substrate 102, thereby realizing the effect of improving the Q value of the inductor structure 200. In addition, if only the exterior wire 106a, the exterior wire 108a, the connecting wire 106c, and the connecting wire 108c are projected on the shielding structure 110 (not shown), this embodiment can also realize the effect of improving the Q value of the inductor structure.

Figure 2D:
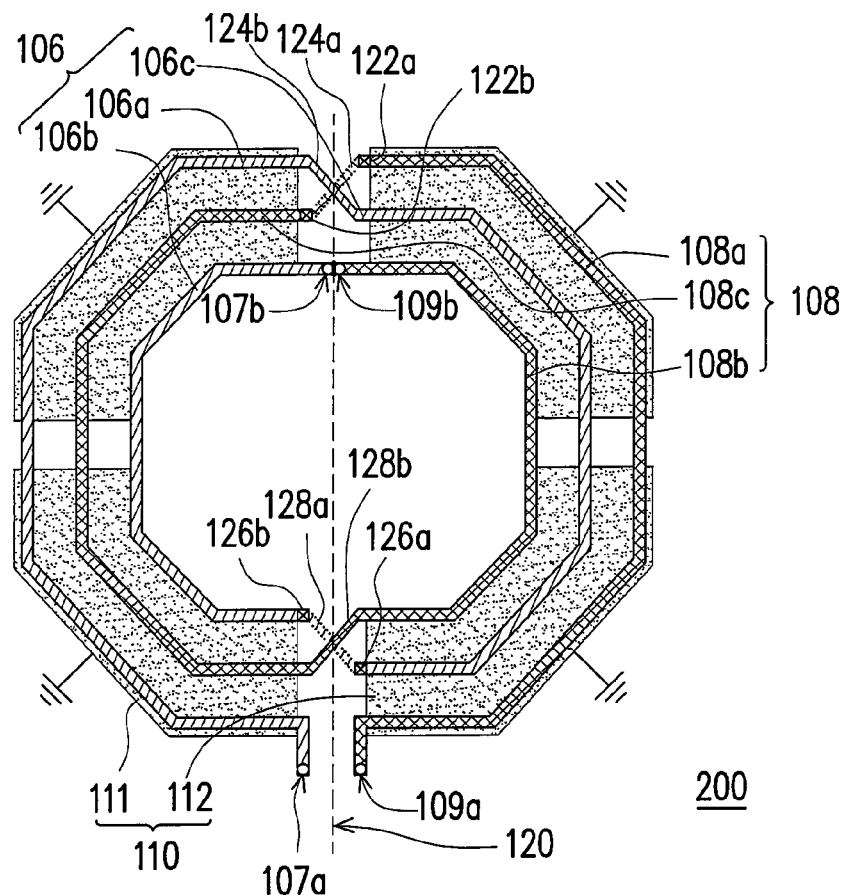
FIG. 2D is a schematic top view of an inductor structure according to a third embodiment of the present invention.
Figure 2E:
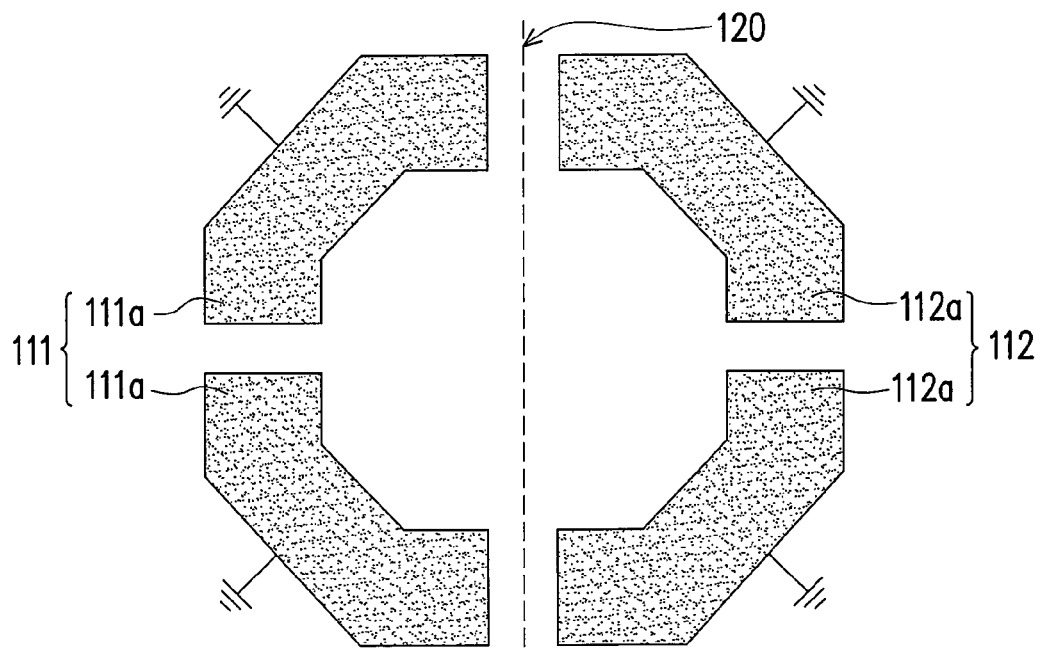
FIG. 2E is a schematic top view of a shielding structure according to the third embodiment of the present invention.

FIG. 2D is a schematic top view of an inductor structure according to a third embodiment of the present invention. FIG. 2E is a schematic top view of a shielding structure according to the third embodiment of the present invention. In FIGS. 2D-2E, like component numerals are used to indicate like components appearing in FIGS. 2A-2B, and will not be described herein again.

Referring to FIGS. 2D and 2E together, the shielding layer 111 can be formed with more than two shielding patterns 111a, and the shielding layer 112 can also be formed with more than two shielding patterns 112a. The shielding patterns 111a and the shielding patterns 112a, for example, are disposed in mirror symmetry about the symmetric plane 120. In other words, the number of the shielding patterns 111a forming the shielding layer 111 equals to the number of the shielding patterns 112a forming the shielding layer 112. Moreover, when the shielding layer 111 and the shielding layer 112 include a plurality of shielding patterns 111a and 112a, the method of grounding the shielding layer 111 and the shielding layer 112 is, for example, grounding the shielding patterns 111a and the shielding patterns 112a individually.

Figure 2F:
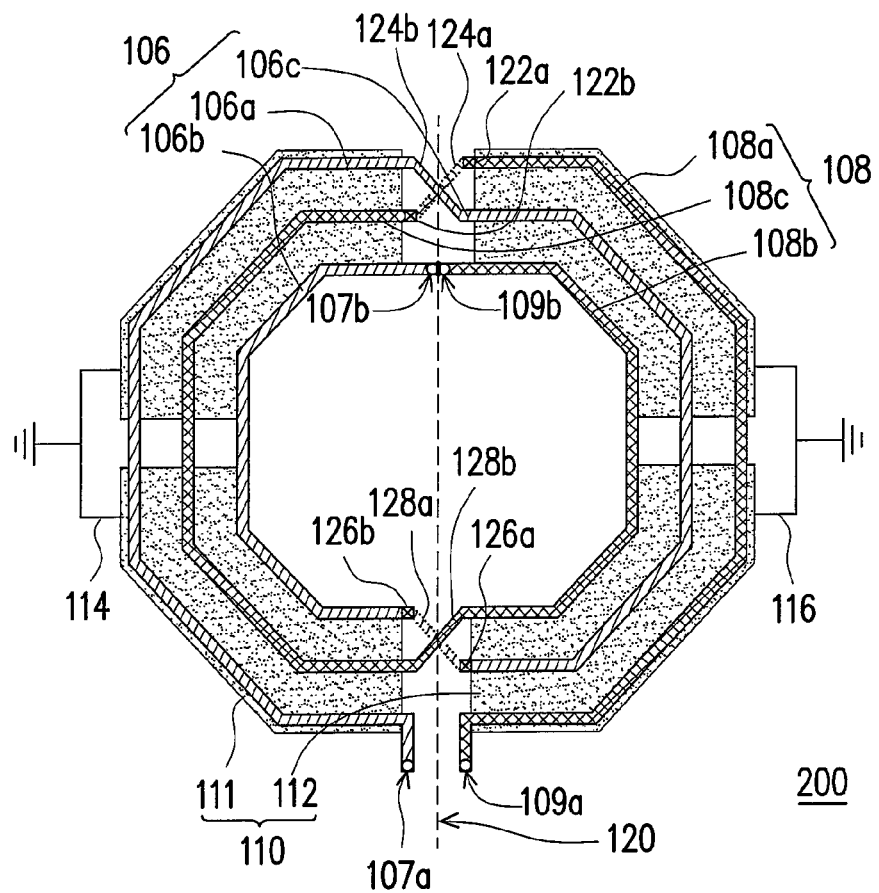
FIG. 2F is a schematic top view of an inductor structure according to a fourth embodiment of the present invention.
Figure 2G:
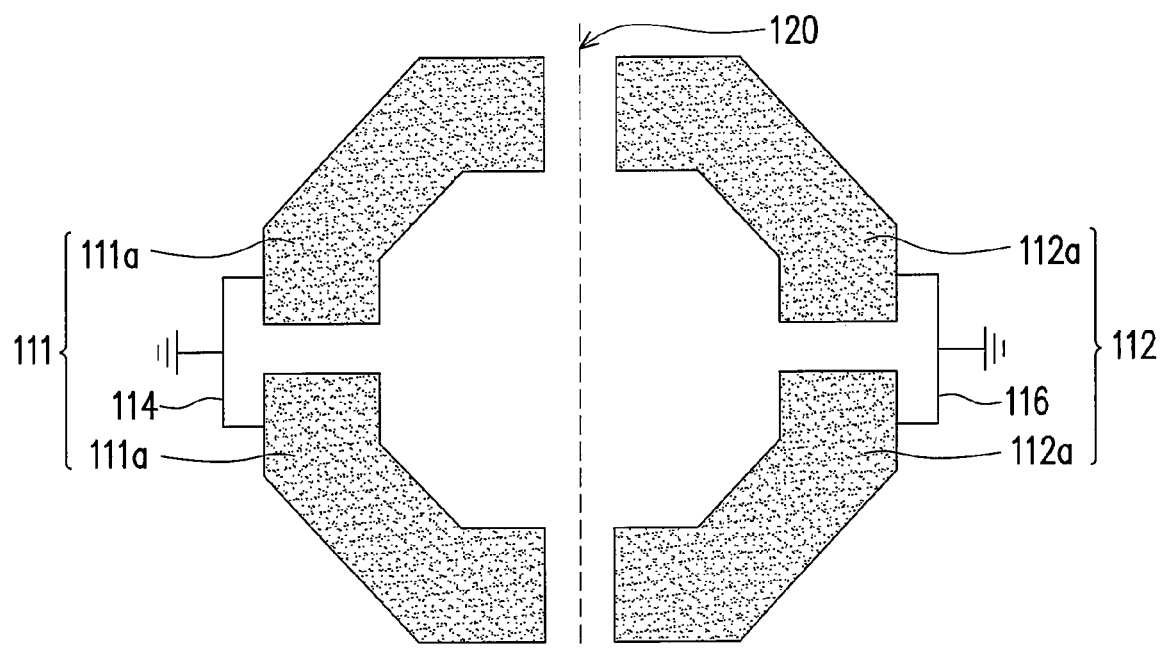
FIG. 2G is a schematic top view of a shielding structure according to the fourth embodiment of the present invention.

FIG. 2F is a schematic top view of an inductor structure according to a fourth embodiment of the present invention. FIG. 2G is a schematic top view of a shielding structure according to the fourth embodiment of the present invention. In FIGS. 2F-2G, like component numerals are used to indicate like components appearing in FIGS. 2D-2E, and will not be described herein again.

When the shielding layer 111 and the shielding layer 112 have a plurality of shielding patterns 111a and 112a, other methods can be adopted to ground the shielding layer 111 and the shielding layer 112 individually. Referring to FIGS. 2F and 2G, the shielding patterns 111a on a same side of the symmetric plane 120 are, for example, connected in series by a grounding wire 114, and the grounding wire 114 is then grounded. Similarly, the shielding patterns 112a on the other side of the symmetric plane 120 are, for example, connected in series by a grounding wire 116, and the grounding wire 116 is then grounded. Thus, the effect of grounding the shielding layer 111 and the shielding layer 112 individually is realized.

Figure 2H:
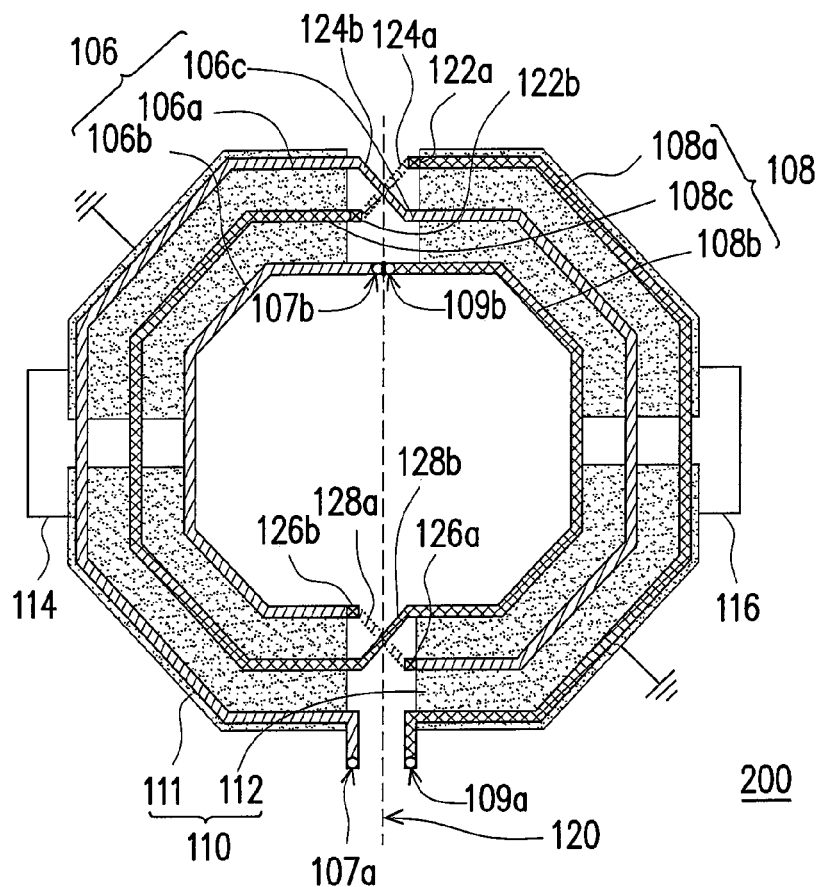
FIG. 2H is a schematic top view of an inductor structure according to a fifth embodiment of the present invention.
Figure 2I:
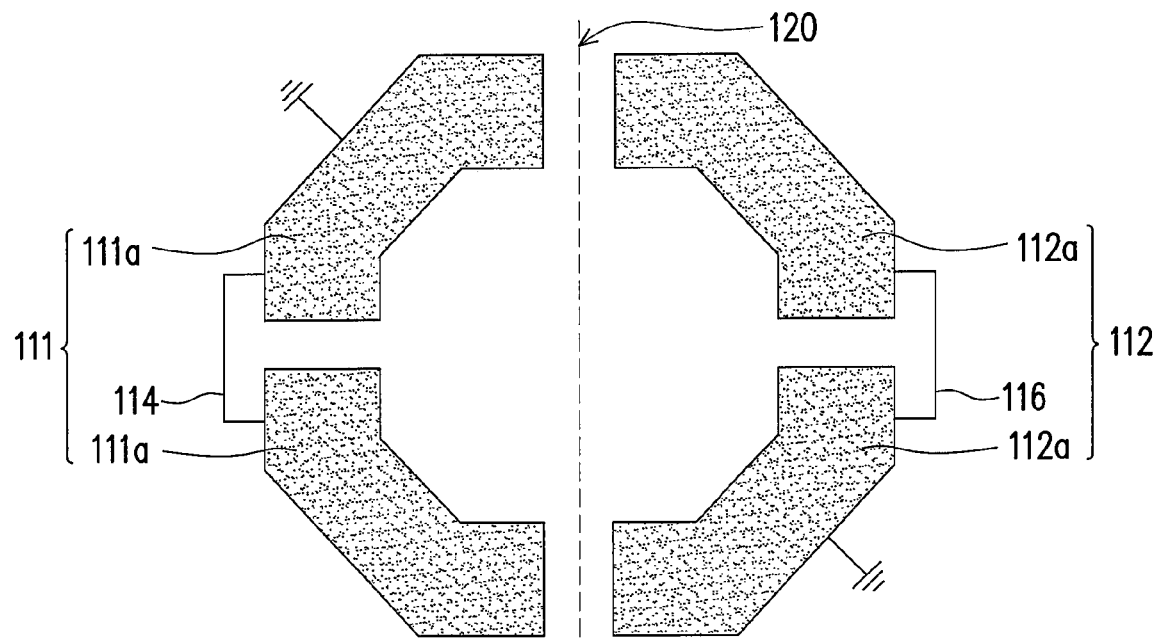
FIG. 2I is a schematic top view of a shielding structure according to the fifth embodiment of the present invention.

FIG. 2H is a schematic top view of an inductor structure according to a fifth embodiment of the present invention. FIG. 2I is a schematic top view of a shielding structure according to the fifth embodiment of the present invention. In FIGS. 2H-2I, like component numerals are used to indicate like components appearing in FIGS. 2D-2E, and will not be described herein again.

When the shielding layer 111 and the shielding layer 112 have a plurality of shielding patterns 111a and 112a, other methods can be adopted to ground the shielding layer 111 and the shielding layer 112 individually. Referring to FIGS. 2H and 2I together, in this embodiment, the shielding layer 111 includes two shielding patterns 111a. One shielding pattern 111a is grounded, and the other shielding pattern 111a achieves the grounding effect, for example, through the grounded shielding pattern 111a by connecting the two shielding patterns 111a with a grounding wire 114. Similarly, the shielding layer 112 includes two shielding patterns 112a. One shielding pattern 112a is grounded, and the other shielding pattern 112a achieves the grounding effect, for example, through the grounded shielding pattern 112a by connecting the two shielding patterns 112a with a grounding wire 116. Thus, the effect of grounding the shielding layer 111 and the shielding layer 112 individually is realized. Moreover, in another embodiment, the grounded shielding patterns are in symmetry about the symmetric plane (not shown). In the above description, the shielding layer including two shielding patterns is taken as an example for illustration, but the present invention is not limited to this. In other embodiments, each of the shielding layers can include more than two shielding patterns disposed in symmetry. Moreover, the method of grounding each of the shielding layers is not limited to the above embodiments, as long as the shielding layers can be grounded individually.

Figure 3:
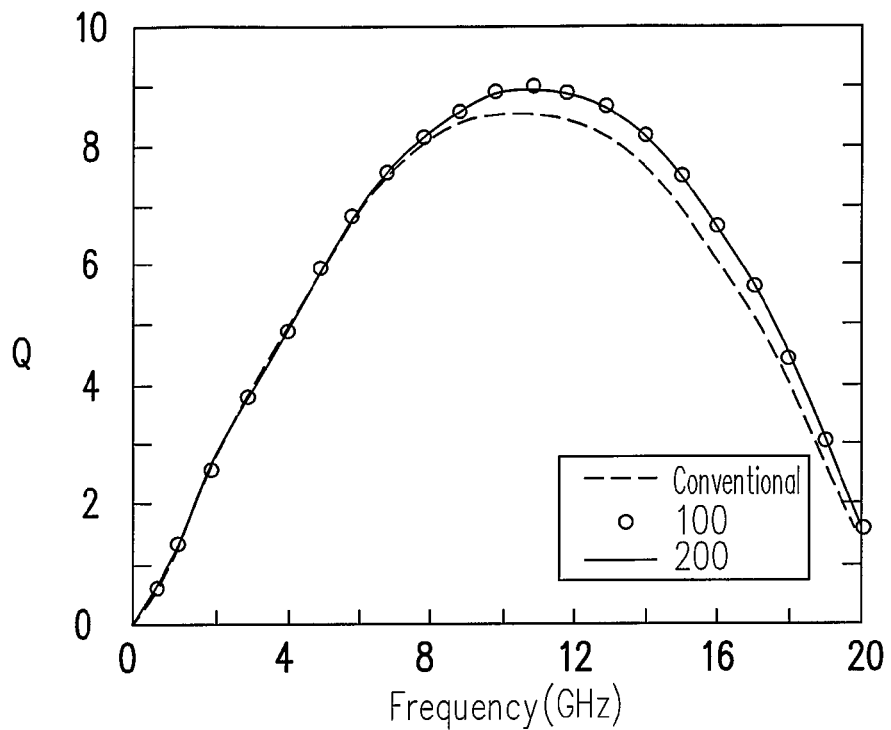
FIG. 3 is a curve diagram of the Q value comparison obtained when the inductor structure of the present invention and a conventional inductor structure are applied in differential applications.
Figure 4:
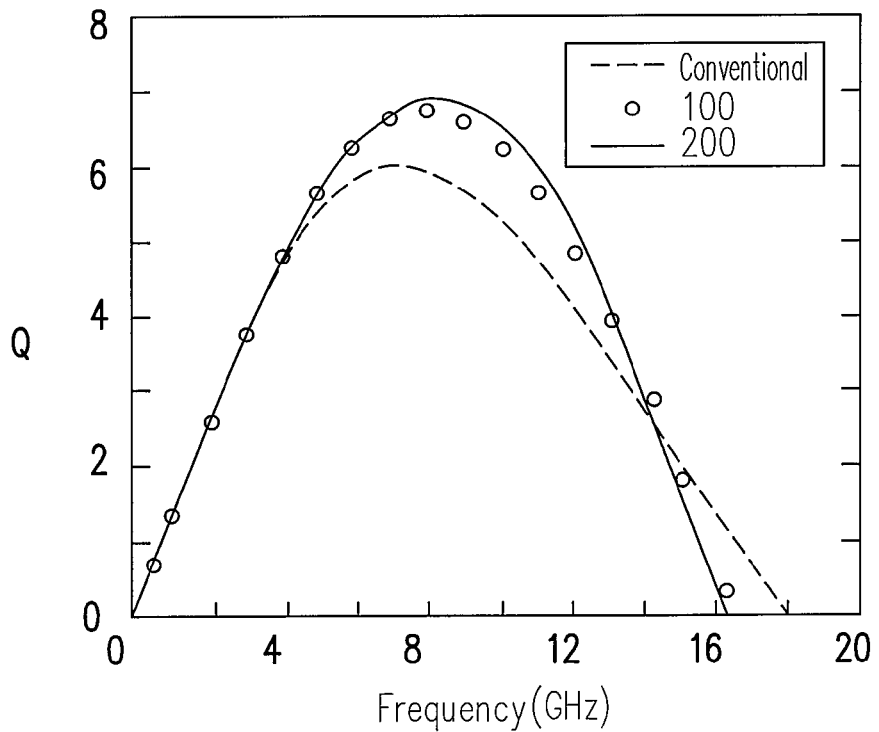
FIG. 4 is a curve diagram of the Q value comparison obtained when the inductor structure of the present invention and a conventional inductor structure are applied in single-ended applications.

FIG. 3 is a curve diagram of the Q value comparison obtained when the inductor structure of the present invention and a conventional inductor structure are applied in differential applications. FIG. 4 is a curve diagram of the Q value comparison obtained when the inductor structure of the present invention and a conventional inductor structure are applied in single-ended applications.

Referring to FIG. 3, results of practical tests show that in a frequency range of 0-20 GHz, the inductor structures 100 and 200 of the present invention both have the Q values higher than that of the conventional inductor structure. Thus, no matter in a low or high frequency range, the inductor structure of the present invention can actually improve the quality of the inductor and further expand the frequency range for the inductor structure.

Referring to FIG. 4, similarly, results of practical tests show that as compared with the conventional inductor structure, the Q values of the inductor structures 100 and 200 of the present invention are both improved significantly. Therefore, the inductor structures of the present invention can effectively reduce the parasitic capacitance from inductor to silicon substrate, and improve the quality of the inductors.

To sum up, in the inductor structure provided by the present invention, an annular shielding structure with gaps and symmetric about a symmetric plane is disposed between the helix windings and the substrate. As the shielding structures can at least shield the exterior wires having a stronger electrical field, and the shielding layers in the shielding structures are grounded individually, the inductor structures of the present invention can reduce the parasitic capacitance between the substrate and metals, and reduce the energy loss, thereby improving the quality of the inductors both in differential and the single-ended applications.

In another aspect, the frequency range for the inductor structures of the present invention can remain within the range of an RF circuit, and the fabrication process of the inductor structures can be integrated into the current process, which helps to reduce the cost of the process.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor structure, disposed on a substrate, comprising:
    a first helix winding, at least comprising a first exterior wire and a first interior wire, wherein the first exterior wire is connected with the first interior wire in series, and the first interior wire rotates in helical fashion towards a central portion of a helical structure of the first helix winding;
    a second helix winding, intercoiled with the first helix winding about a symmetric plane, the second helix winding at least comprising a second exterior wire and a second interior wire, wherein the second exterior wire and the second interior wire are connected in series, and the second interior wire rotates in helical fashion towards a central portion of a helical structure of the second helix winding and is connected with the first interior wire; and
    a shielding structure, comprising:
        a first shielding layer, disposed between the first exterior wire and the substrate corresponding to a projection of the first exterior wire; and
        a second shielding layer, disposed between the second exterior wire and the substrate corresponding to a projection of the second exterior wire, wherein the first shielding layer and the second shielding layer are grounded individually, and are in symmetry about the symmetric plane.

2. The inductor structure of claim 1, wherein the first shielding layer and the second shielding layer are separated.

3. The inductor structure of claim 1, wherein the first interior wire is projected onto the shielding structure.

4. The inductor structure of claim 3, wherein the second interior wire is projected onto the shielding structure.

5. The inductor structure of claim 1, wherein the first helix winding and the second helix winding interlace on the symmetric plane while not contact one another at interlaced positions.

6. The inductor structure of claim 1, wherein the first helix winding further comprises at least one first connecting wire, and the first connecting wire connects the first exterior wire and the first interior wire, the second helix winding further comprises at least one second connecting wire, and the second connecting wire connects the second exterior wire and the second interior wire, wherein the first connecting wire and the second connecting wire are in symmetry about the symmetric plane.

7. The inductor structure of claim 6, wherein the first connecting wire is projected onto the shielding structure.

8. The inductor structure of claim 7, wherein the second connecting wire is projected onto the shielding structure.

9. The inductor structure of claim 1, wherein the first shielding layer is constituted by at least one first shielding pattern.

10. The inductor structure of claim 9, wherein when the first shielding layer is constituted by a plurality of first shielding patterns, the first shielding patterns are grounded individually.

11. The inductor structure of claim 9, wherein when the first shielding layer is constituted by a plurality of first shielding patterns, the first shielding patterns are connected in series.

12. The inductor structure of claim 9, wherein the second shielding layer is constituted by at least one second shielding pattern.

13. The inductor structure of claim 12, wherein when second shielding layer is constituted by a plurality of second shielding patterns, the second shielding patterns are grounded individually.

14. The inductor structure of claim 12, wherein when second shielding layer is constituted by a plurality of second shielding patterns, the second shielding patterns are connected in series.

15. The inductor structure of claim 1, wherein an operating voltage applied on the first exterior wire and an operating voltage applied on the second exterior wire have a same absolute value but opposite electrical properties.

16. The inductor structure of claim 1, wherein an operating voltage is applied on one of the first exterior wire and the second exterior wire, and the other exterior wire is grounded.

17. The inductor structure of claim 1, wherein a material of the shielding layer comprises a conductive material.

18. The inductor structure of claim 17, wherein the conductive material comprises a metal or polysilicon.

* * * * *